United States Patent
Honjo et al.

(10) Patent No.: US 6,333,633 B1
(45) Date of Patent: *Dec. 25, 2001

(54) METHOD FOR INSPECTING A FLEXIBLE PRINTED CIRCUIT

(75) Inventors: Mitsuru Honjo; Yasufumi Miyake; Toshihiko Sugimoto; Ikuo Kawamoto, all of Osaka (JP)

(73) Assignee: Nitto Denko Corporation, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/360,629

(22) Filed: Jul. 26, 1999

(30) Foreign Application Priority Data

Aug. 5, 1998 (JP) .................................................. 10-221970

(51) Int. Cl.$^7$ ...................................................... H01H 31/02
(52) U.S. Cl. ............................................ 324/537; 324/551
(58) Field of Search ................................... 324/537, 761, 324/525, 544, 549, 694, 541, 551

(56) References Cited

U.S. PATENT DOCUMENTS 4,183,609 * 1/1980 Luna ..................................... 324/761
5,744,964 * 4/1998 Sudo et al. ........................... 324/519

FOREIGN PATENT DOCUMENTS 6-43194    2/1994    (JP) .

* cited by examiner

*Primary Examiner*—Safet Metjahic
*Assistant Examiner*—J. Kerveros
(74) *Attorney, Agent, or Firm*—Sughrue Mion, PLLC

(57) ABSTRACT

After a flexible printed circuit is left under an atmosphere of a water vapor pressure of not lower than 30 mmHg so as to absorb moisture, a voltage is applied between two wiring portions to thereby measure an insulation resistance value between the wiring portions during the voltage application. The quantity $\Delta\log(R)$ of the change of the insulation resistance value at regular intervals is obtained. An examination is made as to whether the maximum of the quantity $\Delta\log(R)$ of the change of the insulation resistance value is not larger than a predetermined reference value or not. From this examination, a judgment is made as to whether the flexible printed circuit is good or not.

11 Claims, 3 Drawing Sheets

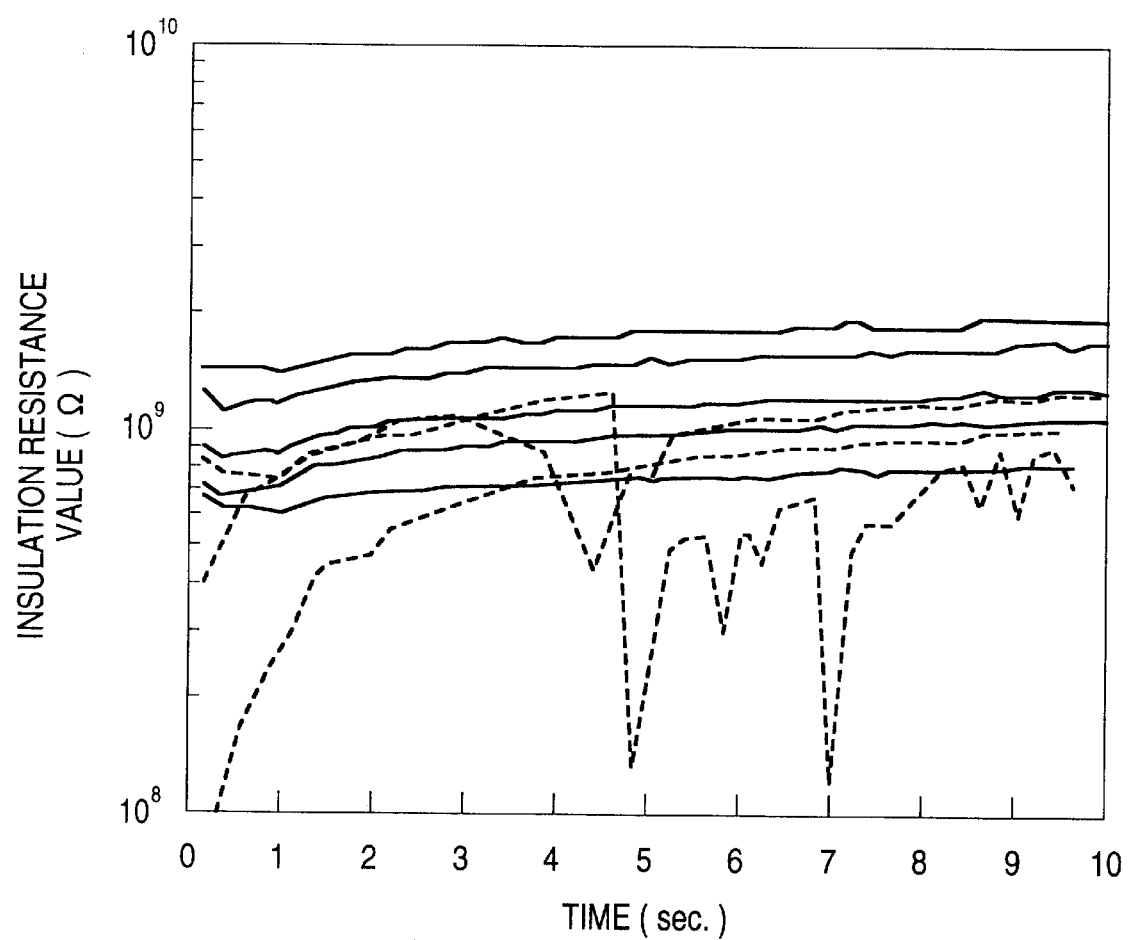

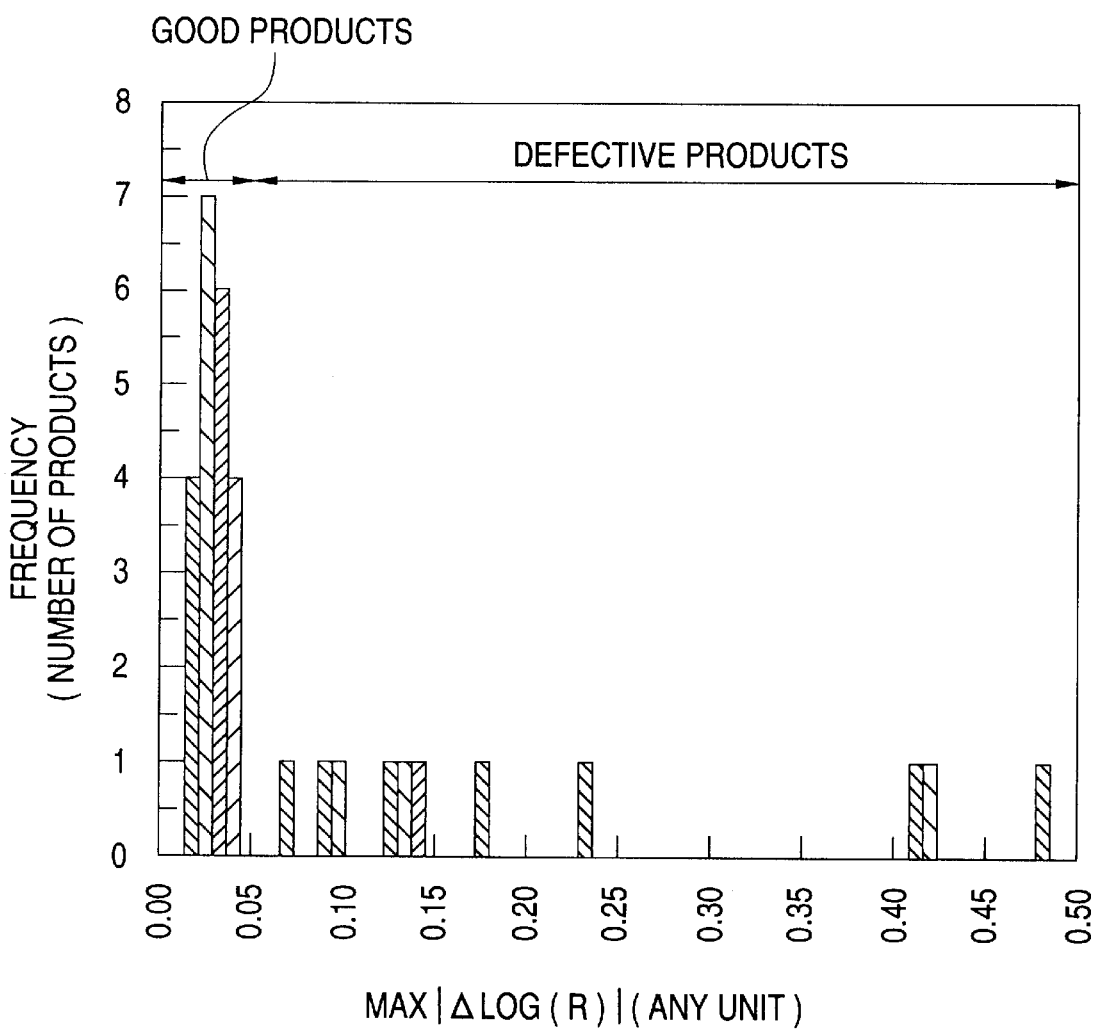

METHOD FOR INSPECTING A FLEXIBLE PRINTED CIRCUIT

BACKGROUND OF THE INVENTION

1. Field of the Invention

The present invention relates to a method for inspecting a flexible printed circuit.

The present application is based on Japanese Patent Application No. Hei. 10-221970, which is incorporated herein by reference.

2. Description of the Related Art

Flexible printed circuits (FPC) are used in various electric or electronic appliances. Each of the flexible printed circuits is constituted by an electrically insulating film of a polyimide resin or the like, and wiring patterns of metal foil of copper or the like formed on the electrically insulating film. Such a flexible printed circuit can be provided in a narrow space because it is flexible and thin. Accordingly, reduction in size and thickness of the appliances can be attained.

With the requirement of reducing the size and increasing the degree of integration in electric or electronic appliances, the inter-wiring pitch in the flexible printed circuit has been also narrowed in recent years. Accordingly, when elution of metal ions (ion migration) from a wiring material in the flexible printed circuit occurs, there is a tendency that inter-wiring short-circuiting occurs easily. For example, the ion migration causes the case where the life is shortened to 100 hours in a test under a condition of a temperature of 85° C. and a humidity of 85%.

Accordingly, flexible printed circuits being short-lived because of ion migration are required to be removed as defective products in an inspection stage before shipping. In the short-lived flexible printed circuits, it has been found that foreign matters such as ion impurities, fiber, etc. are present between wiring portions. Accordingly, defective products can be detected when inter-wiring foreign matters in each of the flexible printed circuits are detected by using a microscope.

It is, however, very inefficient to detect inter-wiring foreign matters in the flexible printed circuits individually by microscopic observation. This method is impracticable as an inspection method before shipping.

A method for performing inspection efficiently to detect short-lived flexible printed circuits before shipping has been, therefore, required.

SUMMARY OF THE INVENTION

An object of the present invention is to provide an inspection method in which discrimination between good flexible printed circuits and poor ones can be made efficiently.

The present inventor has made various experiments and investigations. As a result, there has been obtained a knowledge that the quantity of change of an inter-wiring insulation resistance value during application of a voltage in a flexible printed circuit after moisture absorption has a specific relation to the life of the flexible printed circuit. The following invention has been designed on the basis of this relation.

According to the present invention, the method for inspecting a flexible printed circuit comprises the steps of: making moisture absorbed into a flexible printed circuit which is a subject of inspection; and making a judgment as to whether the flexible printed circuit is good or not on the basis of a quantity of change of an inter-wiring insulation resistance value under a condition of application of a predetermined voltage.

In the method for inspecting a flexible printed circuit according to the present invention, discrimination between good flexible printed circuits and poor ones can be made by electrical measurement because the discrimination between good flexible printed circuits and poor ones is made on the basis of the quantity of the change of an inter-wiring insulation resistance value during application of a voltage in a flexible printed circuit after moisture absorption. Accordingly, flexible printed circuits can be inspected efficiently.

Preferably, the method for inspecting a flexible printed circuit, comprising the steps of: making moisture absorbed into a flexible printed circuit which is a subject of inspection; and measuring a quantity of change of an inter-wiring insulation resistance value measured at regular intervals under a condition of application of a predetermined voltage to thereby conclude that the flexible printed circuit is good when a maximum value of the quantity of change of the insulation resistance value is not larger than a predetermined reference value.

In this case, discrimination between good flexible printed circuits and poor ones can be made easily and evenly by comparison of the maximum of the quantity of the change of the insulation resistance value with a predetermined reference value.

Preferably, the quantity of change of the insulation resistance value is expressed as a difference between common logarithms of the insulation resistance values at two points of time. In this case, the predetermined reference value may be 0.05.

When the quantity of the change of the insulation resistance value is expressed in a difference between common logarithms of insulation resistance values at two points of time, the bad influence of variations in inter-wiring distance and in inter-wiring applied-voltage is suppressed so that an accurate discrimination result is obtained.

Preferably, the flexible printed circuit as a subject of inspection is left under a condition of high temperature and high humidity for a predetermined time so as to absorb moisture. When the flexible printed circuit is left under a condition of constant temperature and constant humidity for a predetermined time so as to absorb moisture, the quantity of water absorption of the flexible printed circuit can be kept constant.

According to the present invention, there is provided a flexible printed circuit wherein a maximum value of a quantity of change of an inter-wiring insulation resistance value measured at regular intervals under a condition of application of a predetermined voltage after moisture absorption is not larger than a predetermined reference value.

When the maximum of the quantity of the change of an inter-wiring insulation resistance value measured at regular intervals under a condition of application of a predetermined voltage after moisture absorption is not larger than a predetermined reference value, the flexible printed circuit is long-lived because inter-wiring short-circuiting due to ion migration is not caused.

Features and advantages of the invention will be evident from the following detailed description of the preferred embodiments described in conjunction with the attached drawings.

BRIEF DESCRIPTION OF THE DRAWINGS

In the accompanying drawings:

FIG. 3 is a graph showing results of measurement of the insulation resistance value during voltage application; and FIG. 4 is a graph showing a histogram for the maximum of the quantity of the change of the insulation resistance value.

DETAILED DESCRIPTION OF THE PREFERRED EMBODIMENTS

Figure 1:
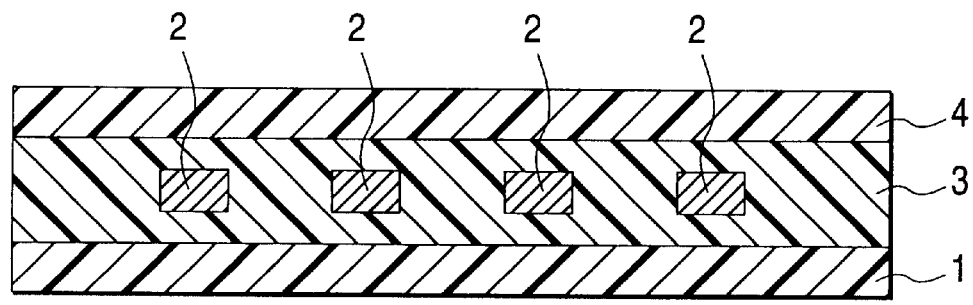
FIG. 1 is a sectional view showing an example of a flexible printed circuit.
Figure 2:
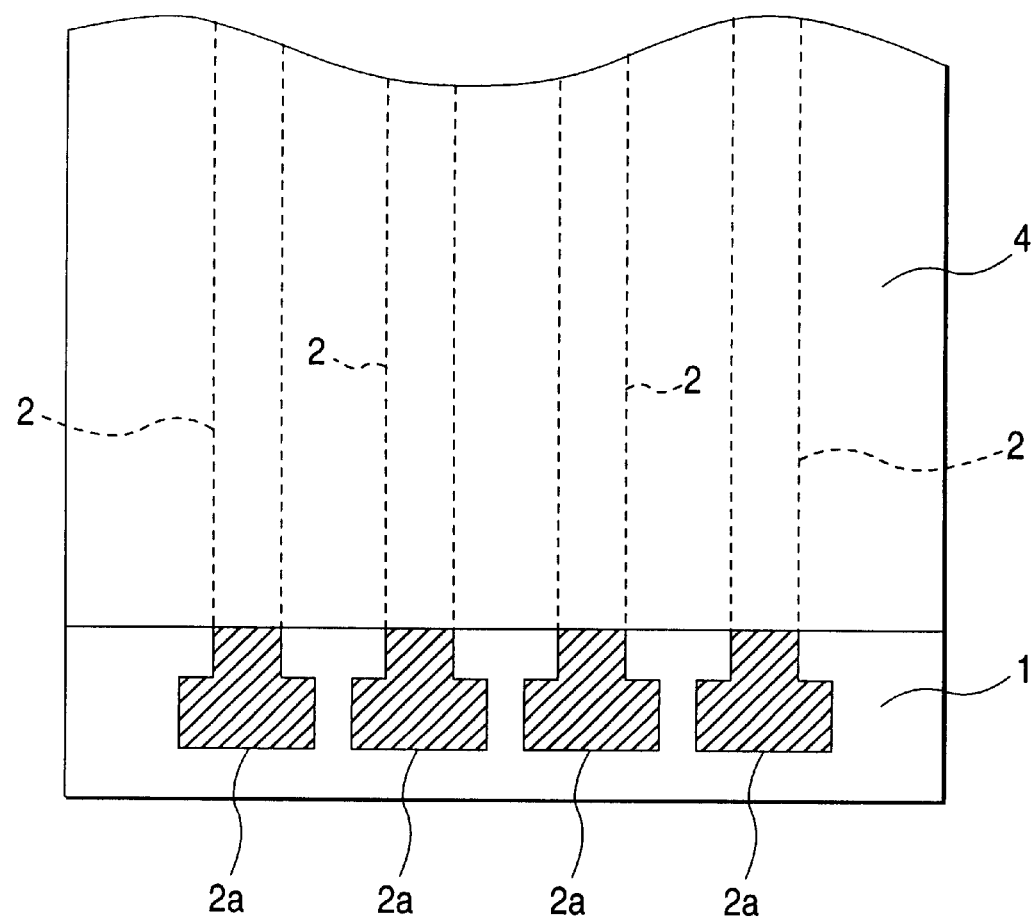
FIG. 2 is a plan view of a part of the flexible printed circuit depicted in FIG. 1.

FIG. 1 is a sectional view showing an example of a flexible printed circuit. FIG. 2 is a plan view of a part of the flexible printed circuit depicted in FIG. 1.

As shown in FIG. 1, an adhesive agent layer 3 is formed on an electrically insulating film 1. Wiring portions 2 of metal foil are provided in the adhesive agent layer 3. The upper surface of the adhesive agent layer 3 is covered with an electrically insulating film 4. As shown in FIG. 2, bonding pads 2a formed at end portions of the wiring portions 2 by partial removal of both the electrically insulating film 4 and the adhesive agent layer 3 are exposed on the electrically insulating film 1.

As for the electrically insulating films 1 and 4, there is used a polyimide film, a polyparabanic film, a polyester film, a polyethylene naphthalate film, a polyether-sulfone film, a polyether-imide film, a polyether-ether-ketone film, or the like. Particularly, the polyimide film having excellent mechanical, electrical and chemical characteristic is preferably used.

As for the wiring portions 2, there is used metal foil such as copper foil, aluminum foil, nichrome foil, or the like, having good electrically conducting characteristic. If necessary, the metal foil is plated with tin, solder, gold, nickel, or the like.

As for the adhesive agent layer 3, there is used a thermosetting adhesive agent (e.g., an epoxy rubber type adhesive agent or a polyester type adhesive agent containing an isocyanate type hardener added to a polyester resin), a thermoplastic adhesive agent (e.g., a synthetic rubber type adhesive agent or a polyimide type adhesive agent), a tackiness agent (a pressure-sensitive adhesive agent, e.g., an acrylic type tackiness agent), or the like. Further, the aforementioned, various kinds of adhesive agents may be used in combination.

A method for inspecting a flexible printed circuit will be described below.

A flexible printed circuit, which is a subject of inspection, is left under an atmosphere of a water vapor pressure of from 30 mmHg to 760 mmHg, preferably from 45 mmHg to 400 mmHg, for 1 hour or longer, preferably for 6 hours or longer. Alternatively, the flexible printed circuit, which is a subject of inspection, may be immersed in pure water at a temperature of from 20° C. to 100° C., preferably from 30° C. to 50° C., so as to absorb water. Then, while contact probes of a DC electric source are connected to two bonding pads 2a of the flexible printed circuit, a voltage of from 50 V to 1000 V, preferably from 300 V to 600 V, is applied between two wiring portions 2. The voltage application time is from 1 sec to 20 sec, preferably from 5 sec to 15 sec.

If there is a fear that a large charging current is passed to operate a protection circuit of the DC electric source when a high voltage is initially applied between the wiring portions 2, the voltage applied between the wiring portions 2 may gradually raise from a low voltage to a high voltage.

The insulation resistance value R between the wiring portions 2 is measured at regular intervals during the voltage application. Further, the quantity $\Delta\log(R)$ of change of the insulation resistance value at regular intervals is obtained. Here is the equation $\Delta\log(R)=\log(R2)-\log(R1)$ in which R1 and R2 are insulation resistance values between the wiring portions 2 at two points of time at an arbitrary time interval. The time interval is in a range of from 0.025 sec to 0.5 sec, preferably from 0.05 sec to 0.3 sec.

Then, an examination is made as to whether the maximum of the quantity $\Delta\log(R)$ of the change of the insulation resistance value is larger than a predetermined reference value or not. A judgment is made as to whether the flexible printed circuit is good or not on the basis of the examination.

The reference value for the judgment can be determined in advance as follows. After the quantity $\Delta\log(R)$ of the change of the insulation resistance value in each of a plurality of flexible printed circuits of the same kind is measured by the aforementioned method, a judgment is made by another testing method as to whether each flexible printed circuit is good or not. The other testing method is a method using an insulation failure test under a condition of high temperature and high humidity, a method using microscopic observation of foreign substances between wiring portions, or the like.

As described above, in the method for inspecting a flexible printed circuit according to the present invention, discrimination between good flexible printed circuits and poor ones can be made on the basis of the quantity $\Delta\log(R)$ of the change of the insulation resistance value during the voltage application in each flexible printed circuit after moisture absorption. In this case, the discrimination between good flexible printed circuits and poor ones can be made on the basis of electrical measurement, so that a large number of flexible printed circuits can be inspected efficiently and evenly.

In this inspection method, the discrimination between good flexible printed circuits and poor ones can be made not on the basis of the inter-wiring insulation resistance value R in each flexible printed circuit but on the basis of the examination as to whether the maximum of the quantity $\Delta\log(R)$ of the change of the insulation resistance value is not larger than a reference value or not. Accordingly, the bad influence of variations in inter-wiring distance and inter-wiring applied-voltage is suppressed so that accurate judgment results are obtained.

The relation between the quantity of the change of the insulation resistance value and the discrimination between good flexible printed circuits and poor ones in the aforementioned inspection method was examined on a plurality of flexible printed circuits. The number of samples were 31.

The material for electrically insulating films 1 and 4 in a flexible printed circuit used as each sample was polyimide. The material for wiring portions 2 in the flexible printed circuit was copper. Further, the thickness of the electrically insulating film 1 was 25 $\mu$m and the thickness of the electrically insulating film 4 was 25 $\mu$m. Further, the thickness of each of the wiring portions 2 was 35 $\mu$m and the pitch between adjacent wiring portions 2 was 0.2 mm. The width of each of the wiring portions 2 was 0.1 mm and the length of each of the wiring portions 2 was 45 mm.

After the flexible printed circuit as each sample was left under an atmosphere of a temperature of 85° C. and a humidity of 85% (a water vapor pressure of 368.6 mmHg) for 6 hours, a voltage of 500 V was applied between two wiring portions 2 and the insulation resistance value R between the wiring portions 2 during the voltage application was measured at intervals of 0.2 sec by the aforementioned method. The voltage application time was set to be 10 sec in total. The insulation resistance value was obtained on the basis of measurement of the current value.

Results of measurement of the insulation resistance value at intervals of 0.2 sec were plotted in a graph.

FIG. 3 shows results of measurement of the insulation resistance value during the voltage application. In FIG. 3, the horizontal axis exhibits time and the vertical axis exhibits the inter-wiring insulation resistance value.

Results of measurement of 8 samples selected from all the samples are shown in FIG. 3. The broken lines show samples regarded as defective products by an insulation failure test which will be described later. The other, solid lines show samples regarded as good products.

Further, the maximum of the quantity $\Delta\log(R)$ of the change of the insulation resistance value in each sample was obtained and a histogram for the maximum of the quantity of the change of the insulation resistance value was generated. FIG. 4 is a graph showing the histogram for the maximum of the quantity of the change of the insulation resistance value.

In FIG. 4, the horizontal axis exhibits the maximum of the absolute value of the quantity of the change of the insulation resistance value and the vertical axis exhibits a frequency. In FIG. 4, the maximum of the absolute value of the quantity of the change of the insulation resistance value is expressed as $\max|\Delta\log(R)|$.

All the samples were then subjected to insulation failure testing and microscopic observation under a condition of high temperature and high humidity. In this case, a sample in which the insulation resistance value was not larger than $1\times10^6$ $\Omega$ when the sample was left under an atmosphere of a temperature of 85° C. and a humidity of 85% for 100 hours while applying a direct current voltage of 100 volt between wiring portions was regarded as a defective product.

In good samples of which the insulation resistance value was larger than $1\times10^6$ $\Omega$ in the aforementioned testing, the maximum of the quantity of the change of the insulation resistance value $\max|\Delta\log(R)|$ was not larger than 0.05. On the other hand, in defective samples of which the insulation resistance value was not larger than $1\times10^6$ $\Omega$ in the aforementioned testing, the maximum of the quantity of the change of the insulation resistance value $\max|\Delta\log(R)|$ was larger than 0.05.

Accordingly, as shown in FIG. 4, in this embodiment, samples were discriminated as good products when the quantity $\Delta\log(R)$ of the change of the insulation resistance value is not larger than 0.05 whereas samples were discriminated as defective products when the quantity $\Delta\log(R)$ of the change of the insulation resistance value is larger than 0.05.

Incidentally, also in the cases where the quantity of the change of the insulation resistance value was measured in the same manner as described above after each sample was left under an atmosphere of a temperature of 85° C. and a humidity of 85% for 12 hours and 24 hours respectively, the same effect as described above was obtained.

Consequently, the discrimination between good flexible printed circuits and poor ones can be made on the basis of the aforementioned inspection method for examining whether the maximum of the quantity of the change of the insulation resistance value is not larger than 0.05 or not.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method for inspecting a flexible printed circuit, comprising the steps of:

making moisture absorb into the flexible printed circuit which is a subject of inspection;

applying a predetermined voltage to wiring portions of the flexible printed circuit; and measuring a quantity of change of an inter-wiring insulation resistance value under an application of the predetermined voltage to thereby judge whether the flexible printed circuit is good or not based on the quantity of the change of the inter-wiring insulation resistance value, wherein the measuring step is performed after the moisture absorbing step.

2. A method for inspecting a flexible printed circuit according to claim 1, further comprising the step of leaving the flexible printed circuit as the subject of the inspection under a condition of high temperature and high humidity for a predetermined time so as to absorb moisture.

3. A method for inspecting a flexible printed circuit, comprising the steps of:

making moisture absorb into the flexible printed circuit which is a subject of inspection;

applying a predetermined voltage to wiring portions of the flexible printed circuit; and measuring a quantity of change of an inter-wiring insulation resistance value measured at regular intervals under an application of the predetermined voltage to thereby conclude that the flexible printed circuit is good when a maximum value of the quantity of change of the insulation resistance value is not larger than a predetermined reference value, wherein the measuring step is performed after the moisture absorbing step.

4. A method for inspecting a flexible printed circuit according to claim 3, wherein the quantity of change of the insulation resistance value is expressed as a difference between common logarithms of the insulation resistance values at two points of time.

5. A method for inspecting a flexible printed circuit according to claim 3, further comprising the step of leaving the flexible printed circuit as the subject of the inspection under a condition of high temperature and high humidity for a predetermined time so as to absorb moisture.

6. A method for inspecting a flexible printed circuit according to claim 4, further comprising the step of leaving the flexible printed circuit as the subject of the inspection under a condition of high temperature and high humidity for a predetermined time so as to absorb moisture.

7. A method for inspecting a flexible printed circuit according to claim 3, wherein the predetermined voltage is in a range of from 50 V to 1000 V.

8. A method for inspecting a flexible printed circuit according to claim 7, wherein the predetermined voltage is in a range of from 300 V to 600 V.

9. A method for inspecting a flexible printed circuit according to claim 3, wherein the regular interval is in a range of from 0.025 sec to 0.5 sec.

10. A method for inspecting a flexible printed circuit according to claim 9, wherein the regular interval is in a range of from 0.05 sec to 0.3 sec.

11. A flexible printed circuit comprising:

an insulating film; and wiring portions formed on said insulating film;

wherein said flexible printed circuit has absorbed moisture; and wherein a maximum value of a quantity of change of an inter-wiring insulation resistance value measured at regular intervals under a condition of application of a predetermined voltage after moisture absorption is not larger than a predetermined reference value.

* * * * *